United States Patent [19]

Griffis

[11] 4,405,948
[45] Sep. 20, 1983

[54] VOLUME CONTROL SIGNAL COUPLING CIRCUIT IN AN AUDIO SIGNAL PROCESSING SYSTEM

[75] Inventor: Patrick D. Griffis, Indianapolis, Ind.

[73] Assignee: RCA Corporation, New York, N.Y.

[21] Appl. No.: 342,896

[22] Filed: Jan. 26, 1982

[51] Int. Cl.³ ............................................. H04N 5/60
[52] U.S. Cl. .................................. 358/198; 179/1 A; 455/218; 455/222
[58] Field of Search ............... 358/198, 190; 179/1 A, 179/1 SW; 455/218, 219, 222, 343; 330/254, 278, 297, 149, 199

[56] References Cited

U.S. PATENT DOCUMENTS

| | | | |
|---|---|---|---|
| 2,850,564 | 9/1958 | Levine | 358/198 |
| 3,327,132 | 6/1967 | Cones et al. | 307/88.5 |
| 3,805,090 | 4/1974 | Kaiser | 307/215 |
| 3,916,321 | 10/1975 | Morse | 455/222 |
| 3,965,295 | 6/1976 | Evans et al. | 179/1 A |
| 4,127,743 | 11/1978 | Ozawa et al. | 179/1 A |
| 4,153,879 | 5/1979 | Sakaida | 455/218 |
| 4,204,170 | 5/1980 | Kage | 328/165 |

OTHER PUBLICATIONS

Circuit Portions of Philips Corporation Color Television Receiver K-12.
Circuit Diagram for "Television Sound Combination" TDA=2790 Published by Philips Corporation, Apr. 1977.
Circuit Portions of Körting Electronic GmbH Color Television Receiver Chassis 9.

Primary Examiner—Richard Murray
Attorney, Agent, or Firm—E. M. Whitacre; P. J. Rasmussen; L. C. Edelman

[57] ABSTRACT

An arrangement for suppressing the audible effects of operating supply voltage transients developed when a sound reproducing system including a gain controlled audio amplifier is initially energized and de-energized. A control path supplies the amplifier with a gain (volume) control voltage of positive and negative senses corresponding to maximum and minimum sound volume. A first capacitor is coupled between the control path and a source of positive operating voltage from which the gain control voltage is derived. A normally non-conductive threshold conduction device and a second capacitor are coupled in series with the first capacitor between the control path and ground. The threshold device is biased to be rendered conductive for coupling positive-going supply voltage transients away from the control path via the second capacitor when the system is initially energized, thereby suppressing the audible effects of the positive transients. Negative-going supply transients developed on the control path when the system is de-energized are in a direction corresponding to minimum volume and are essentially inaudible.

22 Claims, 3 Drawing Figures

VOLUME CONTROL SIGNAL COUPLING CIRCUIT IN AN AUDIO SIGNAL PROCESSING SYSTEM

BACKGROUND OF THE INVENTION

This invention concerns an audio signal processing system including an audio signal volume control network arranged to suppress the audible effects of transients produced at the moment the system is energized or de-energized.

An audio signal processing system often includes provision for controlling the amplitude of audio signals processed by the system, to thereby control the volume of audio information reproduced by a loudspeaker associated with the system. In many signal processing systems, the audio signal amplitude can be conveniently controlled by means of an electronic signal attenuator (e.g., a gain controlled amplifier) which responds to a variable DC gain control (i.e., volume control) voltage. One such electronic attenuator is incorporated in the TDA-2791 integrated circuit commercially available from Philips Corporation. The volume control voltage is commonly derived from a user adjustable volume control potentiometer, and is applied to a gain control input of the electronic attenuator for varying the signal gain of the electronic attenuator and thereby the volume level of a reproduced audio signal, in accordance with the setting of the volume control.

In practice, a filter capacitor is often coupled to the signal path which couples the variable DC gain control voltage to the gain control input of the electronic attenuator. Such capacitor may be required, for example, to remove ripple components which may be present in the DC operating supply voltage associated with the volume control potentiometer, to suppress spurious signals such as noise, and to control the slew rate (rise time) of the volume control voltage when the system is initially energized. In some systems (e.g., including the TDA-2791 integrated circuit or a similar circuit), the electronic attenuator comprises a differential amplifier responsive to the audio signals and to gain control signals, applied to a differential input. Operating supply and bias voltages derived from the system power supply are provided to the differential amplifier, and an operating potential also derived from the system power supply is applied to the volume control potentiometer.

In an audio signal processing system of this type, it is desirable to suppress the audible effects of operating supply voltage transients which can occur when the system is energized and de-energized, respectively causing the operating supply and bias voltages to be applied to and removed from the differentially gain controlled amplifier and the volume control potentiometer. Such transients can cause the amplitude of the output signal from the gain controlled amplifier to increase momentarily with a magnitude and sense for producing an annoying audible "thump" from the sound reproducing loudspeaker of the system. The audible effects of transients associated with energization and de-energization of the system are suppressed by apparatus arranged according to the present invention.

SUMMARY OF THE INVENTION

According to the present invention, a system for processing audio information signals comprises a gain controlled amplifier having a signal input for receiving audio signals, a gain control input, and a signal output. A loudspeaker is responsive to audio output signals from the amplifier for reproducing the audio information. A gain control signal suitable for controlling the signal gain of the amplifier is coupled to the gain control input of the amplifier via a gain control signal coupling path. An operating supply potential is selectively applied to the amplifier and to the gain control signal generator when the system is energized, and removed when the system is de-energized. The operating supply potential includes a transient component appearing momentarily when the system is initially energized, and a steady-state component appearing at other times when the system is energized. A transient suppression network, including transient signal current conduction paths, is coupled to the gain control signal coupling path, to the operating supply potential, and to a reference potential for preventing the gain control signal at the gain control signal coupling path from being adversely affected by transient effects at the moment the system is energized and de-energized. The network includes a first capacitor, a threshold conduction device and a second capacitor, connected in series, between the operating supply potential and the reference potential.

In accordance with a further feature of the invention, the system also includes a network for developing an auxiliary sound muting signal. The auxiliary signal is applied to the amplifier gain control input via the gain control signal coupling path to which the transient suppression network is connected.

DETAILED DESCRIPTION OF THE DRAWING

Figure 1:
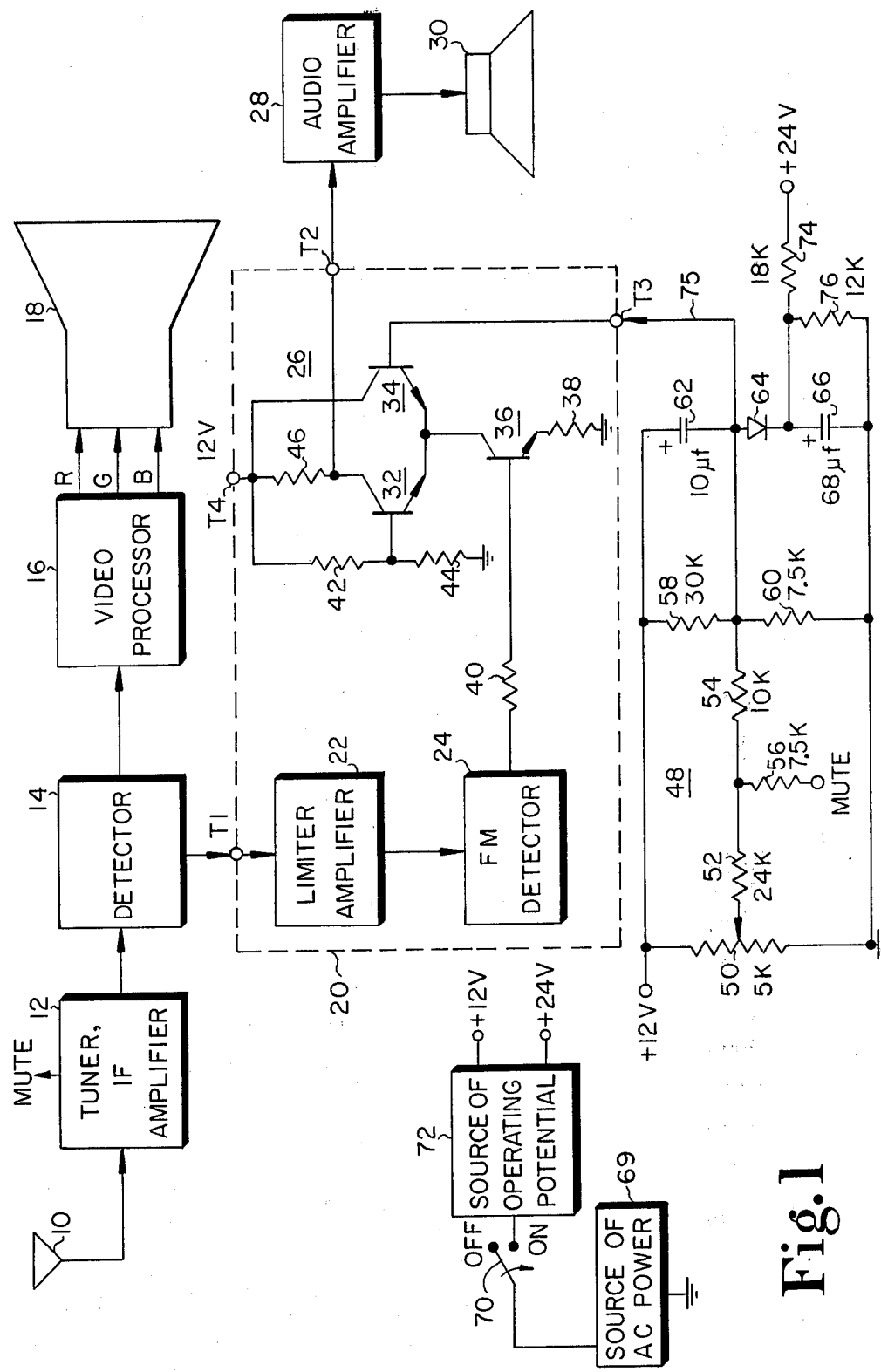
FIG. 1 illustrates, partially in block diagram form and partially in schematic form, a television receiver including an audio signal processing network comprising apparatus according to the present invention.

FIG. 1, composite color television signals received by an antenna 10 are applied to a tuner and intermediate frequency (I.F.) amplifier stage 12. Intermediate frequency signals are coupled from stage 12 to a detector 14, for providing an output baseband video signal and an I.F. intercarrier sound signal, in any one of several well known manners. The baseband video signal is processed by a video processor 16 for providing output red (R), green (G) and blue (B) color image representative video signals, which are applied to a kinescope 18 for reproducing a color image.

The I.F. signal from detector 14 is frequency modulated with audio information and is applied to a sound I.F. signal processing circuit 20 via a terminal T1. Circuit 20 includes an I.F. limiter amplifier 22, an FM detector 24 and an electronic attenuator circuit 26. The sound I.F. signal is amplified and limited by limiter amplifier 22, and audio frequency signals from amplifier 22 are detected by FM detector 24. The amplitude of the detected audio frequency signals is controlled by electronic attenuator 26, and the controlled audio signals are coupled via a terminal T2 to an audio amplifier 28 which supplies amplified controlled audio signals to a sound reproducing loudspeaker 30.

The volume of the audio signals reproduced by loudspeaker 30 is a function of the amplitude of the audio signals provided from electronic attenuator 26, which amplitude is controlled by a variable DC gain control voltage coupled to a terminal T3 of circuit 20. Electronic attenuator 26 comprises a gain controlled differential amplifier including differentially connected transistors 32 and 34 and an associated current source including a transistor 36 and a resistor 38. Electronic attenuator 26 receives audio signals to be controlled via a resistor 40 and the base input electrode of current source transistor 38.

Circuit 20 is energized by means of a source of positive DC operating potential (+12 volts) applied via a terminal T4. A reference base bias voltage for differentially connected transistor 32 is derived from a voltage divider comprising series resistors 42, 44 and the +12 volt supply voltage. Output signals from differential amplifier 32, 34 are developed across a load resistor 46 coupled between the collector of transistor 32 and terminal T4 to which the +12 volt operating supply voltage is applied. The DC gain control signal applied to terminal T3 is coupled to the input base electrode of transistor 34 for differentially varying the relative current conduction of transistors 32, 34, and thereby the current in resistor 46 and the amplitude of audio signals developed across resistor 46, in accordance with variations of the gain control voltage. Circuit 20 is capable of being constructed as an integrated circuit in large part, in which case terminals T1, T2, T3 and T4 correspond to external connecting terminals of the integrated circuit. For example, circuit 20 may comprise the TDA-2791 sound signal processing integrated circuit. The gain control voltage applied to terminal T3 of circuit 20 is generated by a network 48, including a user adjustable volume control potentiometer 50 coupled between a positive DC voltage supply (+12 volts) and ground. A variable DC gain control voltage from the wiper of potentiometer 50 is coupled to the differential gain control base input of transistor 34 via terminal T3 and a level shifting network comprising resistors 52, 54, 58 and 60 arranged as shown. An auxiliary sound muting control signal (MUTE) is coupled to the gain control signal path via a resistor 56, as will be discussed subsequently.

Electronic attenuator 26 exhibits decreasing signal attenuation, corresponding to increasing volume of a reproduced audio signal, as the gain control voltage applied to transistor 34 increases in a positive direction. Conversely, reduced volume is produced as the gain control voltage is varied in a less positive direction. For example, when electronic attenuator 26 corresponds to the electronic attenuator of the TDA-2791 integrated circuit, minimum signal attenuation (0 db) corresponding to maximum volume results when the gain control voltage applied to terminal T3 is approximately 3.7 volts. Conversely, maximum attenuation of approximately 75 db, corresponding to minimum volume, is produced in response to a control voltage of approximately 2.0 volts at terminal T3.

Operating power for the receiver is derived from a source of AC power 69, which is applied via a switch 70 to a source of DC operating potential 72 (i.e., an AC to DC power supply). Switch 70 corresponds to a user activated on-off switch of the receiver for selectively energizing and de-energizing the various receiver circuits. Source 72 provides plural DC operating voltages for the receiver circuits, including +12 volts and +24 volts among other operating voltages required by the receiver circuits, when switch 70 is closed and connects AC source 69 to DC power supply 72.

Connected to gain control voltage coupling path 75 is a circuit comprising a filter capacitor 62 coupled between the +12 volt operating potential (as derived from source 72) and control path 75, and the series connection of a diode 64 and a capacitor 66 coupled between control path 75 and a point of reference operating potential (ground). Diode 64 is poled for forward current conduction from control path 75 to capacitor 66. Bias for diode 64 is provided by means of a network including resistors 74, 76 and an associated DC voltage (+24 volts) supplied by source 72.

When the receiver is energized and operating in a steady-state condition, the volume control voltage at the wiper of potentiometer 50 can vary between +12 volts and zero volts (ground potential) as potentiometer 50 is adjusted between its extreme positions. This control voltage range is translated by the network including resistors 52, 54, 58 and 60 to a range of approximately +4 volts (maximum volume) to +2 volts (minimum volume) at the junction of resistors 58 and 60.

The operation of the described gain control circuit will now be discussed particularly with respect to the function performed by the circuit comprising capacitor 62, diode 64, and capacitor 66 when the system is initially energized (i.e., when switch 70 is first closed) and when the system is afterwards de-energized (i.e., when switch 70 is opened). Specifically, this circuit is arranged to suppress the audible effects of operating supply transients produced at the moment the system is energized and de-energized (i.e., when the operating voltages from power supply 72 are initially applied to, and afterwards removed from, the system).

The +12 volt output from power supply 72, as applied simultaneously to electronic attenuator 26 and to gain control network 48, comprises a rapidly rising "turn-on" transient voltage component which appears at the moment switch 70 is closed to energize the system, and a steady-state value of +12 volts appearing shortly thereafter. The transient voltage component corresponds to the leading, rising edge (going from 0 volts to +12 volts) of a step-function voltage having a +12 volt steady-state value.

Gain control network 48 applies a voltage divided version of this transient component to gain control path 75. Filter capacitor 62 serves as a low-pass filter for slowing the rise time of the transient component appearing on gain control path 75 by filtering (bypassing) the high frequency harmonics of the transient component, which harmonics would otherwise undesirably modulate gain controlled transistor 34 and result in an undesirable transient volume change. Capacitor 62 also serves to bypass spurious high frequency signals, such as noise, which may appear on gain control path 75.

At the moment the system is energized, the base electrode of transistor 32 receives a bias reference voltage via the voltage divider action of resistors 42 and 44, and transistors 32, 34 are energized via the +12 volt supply. At the same time, the +12 volt turn-on transient voltage component is coupled via capacitor 62 to gain control path 75. Thus, at this time, the gain control voltage on path 75 is momentarily much greater (+12 volts) than the normally expected gain control voltage on path 75 (e.g., approximately +2 to +4 volts). The momentary +12 transient is of a magnitude and sense sufficient to cause circuit 26 to exhibit maximum gain, corresponding to maximum volume, whereby an annoying audio burst or "thump" will be reproduced by loudspeaker 30.

The network including diode 64 and capacitor 66, however, attenuates the amplitude of the turn-on transient developed at gain control path 75. More specifically, at the moment the system is energized, resistors 74 and 76 operate as a voltage divider for the +24 volt supply and apply +9.6 volts to capacitor 66. Assuming the system was previously de-energized long enough for capacitor 66 to have fully discharged, at turn-on, the voltage at the positive plate of capacitor 66 will increase exponentially from 0 volts to +9.6 volts. Since the +12 volt transient coupled to the anode of diode 64 by capacitor 62 is more positive than the voltage applied to its cathode by capacitor 66 (i.e., 0 to +9.6 volts), diode 64 is forward-biased and rendered conductive. Consequently, at this time, capacitors 62 and 66 form a capacitive voltage divider which attenuates the +12 volt transient on control path 75 in accordance with the ratio of the reactive impedance of capacitor 66 to the sum of the reactive impedances of capacitors 62 and 66. In this example, the capacitance of capacitor 66 is approximately seven times larger than the capacitance of capacitor 62. Thus, the turn-on transient component on control path 75 is attenuated to approximately one-eighth of its original +12 volt level (i.e., to +1.5 volts). Since this voltage level is less than the minimum volume voltage level (approximately +2 volts), an audible transient-induced "thump" is not produced. The charging impedance for capacitor 66, as determined by the bias network including resistors 74 and 76, should be large enough to prevent capacitor 66 from charging too quickly when the system is initially energized, to thereby insure that diode 64 remains conductive during the occurrence of the turn-on transient component so that the transient can be significantly suppressed as discussed above.

Shortly thereafter, the +12 volt output from power supply 72 exhibits a steady-state DC level of +12 volts. Capacitor 62 prevents this +12 volt operating supply voltage from reaching gain control path 75. Gain control of circuit 26 proceeds normally in response to the control voltage derived from potentiometer 50 after the steady-state condition is reached. During this steady-state condition, the normal DC control voltage range provided by network 48 (approximately +2 to +4 volts), maintains diode 64 in a reverse-biased condition, thereby isolating capacitor 66 from gain control line 75 and preventing the capacitance of capacitor 66 from affecting the time constant established by capacitor 62.

When switch 70 is opened, the system is de-energized and the supply voltages provided by source 72 include a decreasing amplitude "turn-off" transient voltage component which drops rapidly to zero volts. The base voltage of transistor 32 and the gain control voltage generated by network 48 consequently decrease. The attenuation provided by circuit 26 does not decrease during de-energization since the voltage at terminal T3 falls at the same or a greater rate than the voltage at the base of transistor 32. Capacitor 62 effectively couples the entire decreasing turn-off transient component to terminal T3 and voltage divider resistors 42 and 44 couple only a proportion of the turn-off transient to the base of transistor 32. Accordingly, an annoying transient-induced volume increase is not produced upon de-energization of the system. Capacitor 66, which was charged to +9.6 volts during steady-state system operation, discharges via resistors 74 and 76 upon de-energization of the system. The voltage on capacitor 66 is not coupled to gain control path 75 since diode 64 remains non-conductive. In particular, upon turn-off, the decreasing amplitude of the turn-off voltage transient component is coupled via capacitor 62 to the anode of diode 64, maintaining diode 64 reverse biased. No audible effects are produced since the magnitude and polarity of this turn-off transient component corresponds to maximum signal attenuation (minimum volume) provided by circuit 26.

As noted previously, tuner stage 12 provides a control signal MUTE. This control signal is generated during channel changing intervals, at which times it is desirable to mute the television sound. The mute control signal can be generated in the manner discussed in U.S. Pat. No. 3,707,597 (Lunn) in a mechanical tuning arrangement, and in the RCA Television Service Data Bulletin (No. C-7, 1979) for the CTC-101 Series color television receiver, available from RCA Consumer Electronics Division, Technical Publications, Indianapolis, Ind. in an electronic tuning arrangement. The MUTE signal comprises a negative-going voltage pulse having a duration substantially equal to the duration of the channel changing interval. The sound muting function is advantageously accomplished by applying the MUTE signal to electronic attenuator 26 via gain control path 75. The fall time of the leading edge of the MUTE signal as applied to control path 75 is established such that, when sound muting occurs, the gain control voltage produced on gain control path 75 changes slow enough so that an audible "thump" is not produced. Also, the fall time of the MUTE signal on control path 75 should be fast enough so that the sound is muted substantially at the same time channel changing occurs. Finally, the rise time of the MUTE signal should be fast enough so that normal sound is not appreciably muted after the channel changing interval has ended. For this purpose, the MUTE signal rise time and fall time may be tailored by appropriately choosing the value of capacitor 62. Additionally, the value of capacitor 62 preferably should be sufficient to permit capacitor 62 to bypass spurious signals such as noise away from gain control path 75, and to provide the previously mentioned controlled rise time of the gain control voltage generated by resistor network 48 to prevent gain control voltage step changes during system energization.

Figure 2:
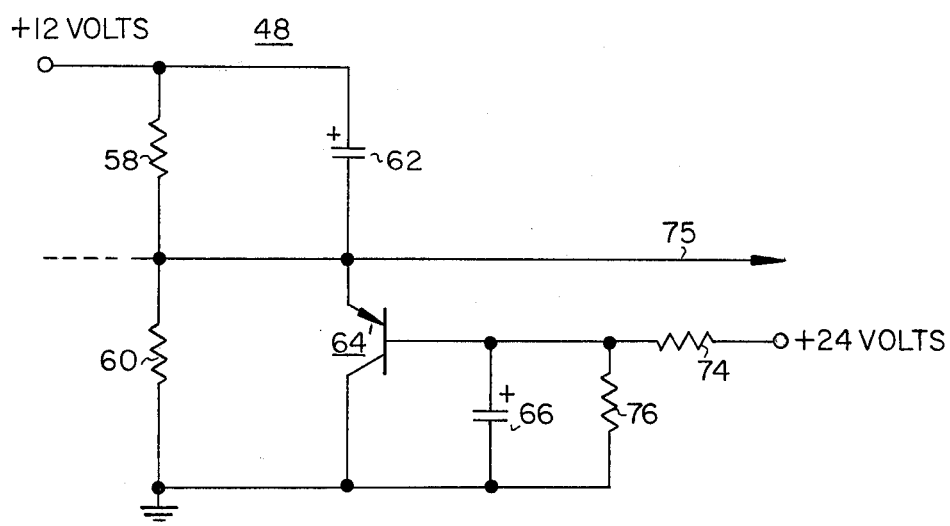
FIGS. 2 and 3 show alternative embodiments of apparatus according to the invention.

FIG. 2 shows an alternative arrangement of network 48, wherein diode 64, as shown in FIG. 1, is replaced by the emitter-base junction of transistor 64' in FIG. 2. In the operation of network 48 of FIG. 2, the positive turn-on transient is bypassed to ground via the collector-emitter path of transistor 64'. This represents the primary mechanism for attenuating the turn-on transient component on control path 75. Although capacitor 66 does not control the degree of attenuation by means of voltage divider action as in the case in the arrangement of FIG. 1, capacitor 66 still serves to control the duration of conduction of transistor 64' for attenuating the turn-on transient as in the case of the FIG. 1 arrangement with respect to diode 64.

Figure 3:
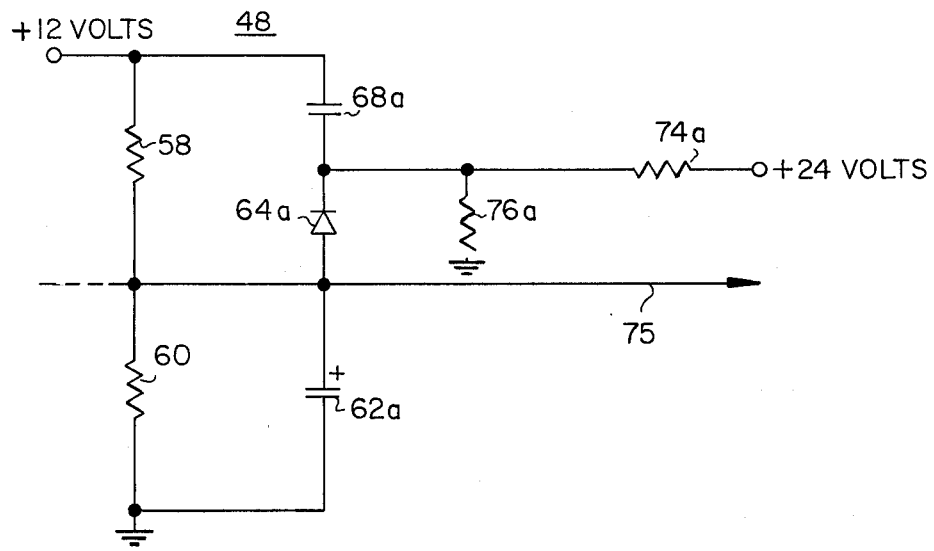

FIG. 3 shows an alternative arrangement wherein a filter capacitor 62a is coupled between gain control path 74 and a point of ground reference operating potential, and wherein the series combination of a diode 64a and a capacitor 66a is coupled between gain control path 75 and the +12 volt operating supply. Diode 64a is poled for forward current conduction from gain control path 75 to the +12 volt supply. As with capacitor 62 of FIG. 1, capacitor 62a in FIG. 3 serves to slow the rise time of the gain control voltage produced at the moment the system is energized, controls the rise and fall times of the MUTE pulse appearing on gain control path 75 (as discussed in connection with FIG. 1), and serves to bypass spurious signals such as noise from gain control path 75.

A +12 volt operating supply transient, developed when the system is initially energized, is isolated from gain control path 75 since diode 64a is reverse biased (non-conductive) in response to the positive transient, which is coupled via capacitor 66a. The bias network including resistors 74a and 76a maintains diode 64a reverse biased during the normal steady-state operation of the receiver, thus isolating capacitor 66a from gain control path 75.

At the moment the system is de-energized, the +12 volt operating supply voltage drops rapidly to zero volts, causing a negative-going voltage transient to be coupled to diode 64a via capacitor 66a. This transient renders diode 64a forward biased (conductive) to provide a low impedance path for rapidly discharging the voltage stored on capacitor 62a via diode 64a, capacitor 66a, and the +12 volt operating supply terminal. Thus, upon de-energization, the voltage on control path 75 drops at a rate greater than the base bias voltage of transistor 32, for the same reasons previously discussed with respect to de-energization of the FIG. 1 embodiment. Accordingly, an annoying audible, transient-induced volume increase is not produced when the system is de-energized.

What is claimed is:

1. In a system for processing audio frequency signals, apparatus comprising:
    a source of signals representative of audio information;
    a gain controlled amplifier having a signal input for receiving audio signals from said source, a gain control input, and a signal output;
    sound reproducing means responsive to audio output signals from said amplifier for reproducing said audio information;
    means for generating a gain control signal suitable for controlling the signal gain of said amplifier;
    means for coupling said gain control signal to said gain control input of said amplifier via a coupling path;
    means selectively operative for supplying operating potentials to said amplifier and to said generating means when said system is energized, and for removing said operating potentials when said system is de-energized, said operating potentials including an undesired transient component appearing momentarily when said system is initially energized, and a steady-state component appearing at other times when said system is energized;
    wherein said coupling means includes a transient signal voltage divider coupled between first and second operating potentials, for substantially attenuating said transient component at said gain control signal coupling path, said voltage divider comprising:
        a first capacitor defining a transient signal current path from said first operating potential to said gain control signal coupling path, for coupling said undesired energization transient to said control signal coupling path; and
        a second capacitor and a threshold conduction device responsive to said transient component for defining a selectively operative transient signal current path from said gain control signal coupling path to said second operating potential, for coupling said undesired transient component from said gain control signal coupling path to said second operating potential.

2. Apparatus according to claim 1 wherein
    said threshold conduction device is a unilateral current conduction device arranging in series with said second capacitor between said gain control signal coupling path and said second operating potential and being poled for forward current conduction from said gain control signal coupling path to said second operating potential; and
    said first operating potential is positive relative to said second operating potential.

3. Apparatus according to claim 2, wherein
    said threshold conduction device corresponds to a semiconductor PN junction.

4. Apparatus according to claim 2, and further comprising:
    biasing means coupled to said second capacitor and to said threshold conduction device for permitting said threshold device to be conductive during intervals when said transient component is present, when said system is initially energized, and for maintaining said threshold device in a non-conductive condition at said other times when said system is energized.

5. Apparatus according to claim 4, wherein
    said first capacitor, said threshold device, and said second capacitor are coupled in the order named between said first and second operating potentials;
    said gain control signal coupling path is coupled to the junction of said first capacitor and said threshold device; and
    said biasing means is coupled to the junction of said second capacitor and said threshold device.

6. Apparatus according to claim 1, wherein
    an increasing and decreasing level of said gain control signal coupled via said gain control coupling path respectively increasing and decreasing the gain of said amplifier; and
    said undesired transient component exhibits an amplitude transition of a magnitude and sense corresponding to increasing the gain of said amplifier sufficient to produce an audible response from said sound reproducing means.

7. Apparatus according to claim 2, wherein
    said control signal generating means and said amplifier are energized from said first operating potential; and
    said amplifier comprises a differential amplifier with a first differential input for receiving a bias reference potential derived from said first operating potential, and a second differential input for receiving said gain control signal from said gain control signal coupling path.

8. Apparatus according to claim 1 in a system including means for generating an auxiliary sound muting signal, wherein
    said auxiliary signal is coupled to said amplifier gain control input via said gain control signal coupling path.

9. Apparatus according to claim 1, wherein
    the capacitance of said second capacitor is greater than the capacitance of said first capacitor.

10. In a television receiver responsive to received composite television signals corresponding to plural color television signal channels, said receiver including means for processing video components of said television signal, tuner means for selectably rendering said receiver responsive to individual ones of said television channels and providing a sound muting signal during channel changing intervals when said receiver is being tuned from one channel to another; and means for processing a sound component of said television signal, said sound processing means comprising:

a gain controlled amplifier having a signal input for receiving said sound component of said television signal, a gain control input, and a signal output;

sound reproducing means responsive to audio output signals from said amplifier for reproducing said sound component;

means for generating a gain control signal suitable for controlling the signal gain of said amplifier;

means for coupling said gain control signal to said gain control input of said amplifier via a coupling path;

means selectively operative for supplying operating potentials to said amplifier and to said generating means when said system is energized, and for removing said operating potentials when said system is de-energized, said operating potentials including an undesired transient component appearing momentarily when said system is initially energized, and a steady-state component appearing at other times when said system is energized;

a first capacitor defining a transient signal current path between said gain control signal coupling path and a first operating potential;

a second capacitor and a threshold conduction device responsive to said transient component for defining a selectively operative transient signal current path between said gain control path and a second operating potential; and wherein said sound muting signal is coupled to said gain control input of said amplifier via said gain control signal coupling path.

11. Apparatus according to claim 10, wherein said threshold conduction device is a unilateral current conduction device arranging in series with said second capacitor between said gain control signal coupling path and said second operating potential and being poled for forward current conduction from said gain control signal coupling path to said second operating potential.

12. Apparatus according to claim 11, wherein said threshold conduction device corresponds to a semiconductor PN junction.

13. Apparatus according to claim 11, wherein said first operating potential is positive relative to said second operating potential.

14. Apparatus according to claim 11, wherein said second operating potential is positive relative to said first operating potential.

15. Apparatus according to claim 11, and further comprising:

biasing means coupled to said second capacitor and to said threshold conductive device for permitting said threshold device to be conductive during intervals when said transient component is present, and for maintaining said threshold device in a nonconductive condition at said other times when said system is energized.

16. Apparatus according to claim 15, wherein said first capacitor, said threshold device, and said second capacitor are coupled in the order named between said first and second operating potentials;

said gain control signal coupling path is coupled to the junction of said first capacitor and said threshold device; and said biasing means is coupled to the junction of said second capacitor and said threshold device.

17. Apparatus according to claim 10, wherein an increasing and decreasing level of said gain control signal coupled via said gain control coupling path respectively increasing and decreasing the gain of said amplifier; and said undesired transient component exhibits an amplitude transition of magnitude and sense corresponding to increasing the gain of said amplifier sufficient to produce an audible response from said reproducing means.

18. Apparatus according to claim 11, wherein said control signal generating means and said amplifier are energized from said first operating potential; and said amplifier comprises a differential amplifier with a first differential input for receiving a bias reference potential derived from said first operating potential, and a second differential input for receiving said gain control signal from said gain control signal coupling path.

19. In a television receiver responsive to received composite television signals corresponding to plural color television signal channels, said receiver including means for processing video components of said television signal, tuner means for selectably rendering said receiver responsive to individual ones of said television channels and providing a sound muting signal during channel changing intervals when said receiver is being tuned from one channel to another; and means for processing a sound component of said television signal, said sound processing means comprising:

a gain controlled amplifier comprising a differential amplifier with a first differential input supplied with a bias reference potential derived from an operating potential, a second differential input supplied with a gain control signal, a common input responsive to said sound component, and a signal output;

means for generating a gain control signal suitable for controlling the signal gain of said amplifier;

means for coupling said gain control signal to said second differential input of said amplifier via a coupling path;

means selectively operative for supplying operating potentials to said amplifier and to said generating means when said system is energized, and for removing said operating potentials when said system is de-energized, said operating potentials including an undesired transient component appearing momentarily when said system is initially energized, and a steady-state component appearing at other times when said system is energized;

a first capacitor defining a transient signal current path from said first operating potential to said gain control signal coupling path, for coupling said undesired energization transient component to said control signal coupling path; and a second capacitor and a unilateral current conduction device responsive to said transient component for defining a selectively operative transient signal current path from said gain control signal coupling path to said second operating potential, for coupling said undesired transient component from said gain control signal coupling path to said second operating potential;

biasing means coupled to the junction of said second capacitor and said unilateral current conduction device for permitting said unilateral current conduction device to be conductive during intervals when said transient component is present when said system is initially energized, and for maintaining said unilateral current conduction device in a non-conductive condition at said other times when said system is energized; and wherein said sound muting signal is coupled to said second differential input of said amplifier via said gain control signal coupling path.

20. In a system for processing audio frequency signals, apparatus comprising:

a source of signals representative of audio information;

a gain controlled amplifier having a signal input for receiving audio signals from said source, a gain control input, and a signal output;

sound reproducing means responsive to audio output signals from said amplifier for reproducing said audio information;

means for generating a gain control signal suitable for controlling the signal gain of said amplifier;

means for coupling said gain control signal to said gain control input of said amplifier via a coupling path;

means selectively operative for supplying operating potentials to said amplifier and to said generating means when said system is energized, and for removing said operating potentials when said system is de-energized, said operating potentials including transient components appearing momentarily when said system is initially energized and de-energized respectively, and a steady-state component appearing at other times when said system is energized;

a first capacitor connected between said gain control signal coupling path and a first operating potential; and a series combination of a second capacitor and a threshold conduction device defining a selectively operative transient signal current path between said gain control signal coupling path and a second operating potential, more positive than said first operating potential; said threshold device being rendered non-conductive in response to said energization transient component, and being rendered conductive in response to said de-energization transient component.

21. In a system, apparatus comprising:

a source of information representative signals to be processed;

a gain controlled amplifier having a signal input for receiving said information representative signals from said source, a gain control input, and a signal output;

means for processing output signals from said amplifier;

means for generating a gain control signal suitable for controlling the signal gain of said amplifier;

means for coupling said gain control signal to said gain control input of said amplifier via a coupling path;

means for selectively supplying operating potentials to said amplifier and to said generating means when said system is energized, and for removing said operating potentials when said system is de-energized, said operating potentials including transient components appearing momentarily when said system is initially energized or de-energized, and a steady-state component appearing at other times when said system is energized;

wherein said coupling means includes a transient signal coupling path coupled between first and second operating potentials, or substantially attenuating said transient components at said gain control signal coupling path, said transient signal coupling path comprising:

a first capacitor defining a transient signal current path from one of said first and second operating potentials to said gain control signal coupling path; and a second capacitor and a threshold conduction device responsive to said transient components for defining a selectively operative transient signal current path from said gain control signal coupling path to the other of said first and second operating potentials, for coupling said undesired transient component from said control signal coupling path to said other one of said operating potentials.

22. In a system for processing information signals, apparatus comprising:

a source of signals representative of said information;

a gain controlled amplifier having a signal input for receiving said information signals from said source, a gain control input, and a signal output;

means responsive to said output signals from said amplifier for reproducing said information;

means for generating a gain control signal suitable for controlling the signal gain of said amplifier;

means for coupling said gain control signal to said gain control input of said amplifier via a coupling path; and means for selectively supplying operating potentials to said amplifier and to said generating means when said system is energized, and for removing said operating potentials when said system is de-energized, said operating potentials including an undesired transient component appearing momentarily when said system is initially energized, and a steady-state component appearing at other times when said system is energized;

wherein said coupling means includes a transient signal coupling path coupled between first and second operating potentials, for substantially attenuating said transient component at said gain control signal coupling path, said transient signal coupling path comprising:

a first capacitor defining a transient signal current path from said first operating potential to said gain control signal coupling path, for coupling said undesired transient component to said control signal coupling path; and a transistor, including a base electrode responsive to said transient component and an emitter to collector path for defining a selectively operative transient signal current path from said gain control signal coupling path to said second operating potential, for coupling said undesired transient component from said control signal coupling path to said second operating potential.

* * * * *

UNITED STATES PATENT AND TRADEMARK OFFICE
CERTIFICATE OF CORRECTION

PATENT NO. : 4,405,948

DATED : September 20, 1983

INVENTOR(S) : Patrick D. Griffis

It is certified that error appears in the above-identified patent and that said Letters Patent is hereby corrected as shown below:

Column 3, Line 30
  The word -- The -- should
  start a new paragraph

Column 4, Line 65
  That portion reading "+12 transient"
  should read -- +12 volt transient --

Column 12, Line 12
  That portion reading "or"
  should read -- for --

Signed and Sealed this

Seventeenth Day of January 1984

[SEAL]

Attest:

GERALD J. MOSSINGHOFF

Attesting Officer

Commissioner of Patents and Trademarks